(12) United States Patent
Leenaerts et al.

(10) Patent No.: US 6,784,753 B2
(45) Date of Patent: Aug. 31, 2004

(54) METHOD FOR MODULATING AN OUTPUT VOLTAGE OF A RF TRANSMITTER CIRCUIT, AND RF TRANSMITTER CIRCUIT

(75) Inventors: Dominicus Martinus Wilhelmus Leenaerts, Eindhoven (NL); Eise Carel Dijkmans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 24 days.

(21) Appl. No.: 10/144,528

(22) Filed: May 13, 2002

(65) Prior Publication Data

US 2002/0171498 A1 Nov. 21, 2002

(30) Foreign Application Priority Data

May 16, 2001 (EP) .............................. 01201840

(51) Int. Cl.[7] .............. H03B 5/08; H03B 5/12; H03C 03/00
(52) U.S. Cl. .............. 331/36 C; 331/117 FE; 331/177 V; 331/179; 332/139; 332/141; 455/110
(58) Field of Search .............. 331/16, 18, 34, 331/36 C, 74, 117 R, 117 FE, 117 D, 177 R, 177 V, 179; 332/127, 135, 136, 139, 141; 455/110–113

(56) References Cited

U.S. PATENT DOCUMENTS

| 4,074,209 A | 2/1978 | Lysobey | 332/19 |
|---|---|---|---|
| 4,360,790 A | 11/1982 | Heise | 331/114 |
| 4,498,076 A | * 2/1985 | Lichtblau | 340/572.3 |
| 4,567,473 A | * 1/1986 | Lichtblau | 340/572.3 |
| 4,736,454 A | 4/1988 | Hirsch | 455/129 |
| 4,973,967 A | * 11/1990 | David et al. | 342/122 |
| 5,181,025 A | 1/1993 | Ferguson et al. | 340/870.21 |
| 5,252,981 A | * 10/1993 | Grein et al. | 342/200 |
| 5,376,938 A | * 12/1994 | Martinez et al. | 342/128 |
| 5,387,917 A | * 2/1995 | Hager et al. | 342/68 |
| 5,495,208 A | 2/1996 | Gonzalez et al. | 331/158 |
| 5,697,068 A | 12/1997 | Salvi et al. | 455/76 |
| 6,427,922 B1 | * 8/2002 | Marchand | 235/494 |

* cited by examiner

Primary Examiner—David Mis
(74) Attorney, Agent, or Firm—Aaron Waxler

(57) ABSTRACT

The invention relates to a method for modulating an output voltage of a transmitter circuit comprising a voltage controlled oscillator, a digital/analog converter and an antenna circuit, the method comprising the method comprising sending an output signal of sufficient power from the voltage controlled oscillator directly to the antenna circuit and directly modulating a frequency of the output signal of the voltage controlled oscillator. The invention furthermore relates to a transmitter circuit comprising a voltage controlled oscillator having a tank circuit, a digital/analog converter and an antenna circuit, wherein the voltage controlled oscillator is adapted to send an output signal of sufficient power directly to the antenna circuit and wherein the digital/analog converter is arranged to modulate an output frequency of the voltage controlled oscillator. A capacitive load circuit may be connected to the tank circuit or a crystal oscillator circuit of the voltage controlled oscillator for modulating the frequency of the voltage controlled oscillator.

9 Claims, 3 Drawing Sheets

METHOD FOR MODULATING AN OUTPUT VOLTAGE OF A RF TRANSMITTER CIRCUIT, AND RF TRANSMITTER CIRCUIT

The invention relates to a method for modulating an output voltage of a transmitter circuit, and a transmitter circuit, in particular for Bluetooth and Hiperlan applications, comprising a voltage controlled oscillator having a tank circuit, a digital/analog converter and an antenna circuit.

In some power amplifier applications, a constant envelope modulation is necessary. This is done with an upmixer and a power amplifier. For example, a transmitter circuit for transmitting RE signals is conventionally constructed around the concept of an upmixer and a power amplifier. A voltage controlled oscillator directs a signal to a first port of the upmixer, the second port of the upmixer receives the IF or baseband signal. The upmixer multiplies the two signals, resulting in the RE signal which is then sent to the power amplifier. After being amplified by the power amplifier, the signal is past on to the antenna circuit. The upmixer can be replaced by a phase-locked loop, hereinafter ("PLL-loop") wherein a fractional N partitioner is modulated by the signal to be sent. In this manner, the voltage controlled oscillator is modulated as well, and the modulated signal is sent to the antenna circuit.

This concept for a transmitter circuit can be used as well in applications with a low output power, such as 0 dBm. Examples for such applications are Bluetooth and Hyperlan. The disadvantage is, however, that the efficiency of the power amplifier is low in these applications. This is due to the fact, that the power used in the power amplifier in order to obtain such low output power is not low. In the Bluetooth application, the power amplifier consumes a current of 10 to 15 mA.

In view of the above, it is an object of the invention to provide a method for modulating an output voltage of a RF transmitter circuit and a RF transmitter circuit meeting the standard of the envisioned application and having a lower power consumption as compared to the none methods and circuit respectively for this purpose.

To achieve the above object, a method is provided for modulating an output voltage of a RF transmitter circuit, in particular for Bluetooth and Hiperlan applications, comprising a voltage controlled oscillator, a digital/analog converter and an antenna circuit, the method comprising sending an output signal from the voltage controlled oscillator directly to the antenna circuit and directly modulating a frequency of the output signal of the voltage controlled oscillator. By using this method, the upmixer or franctional N partitioner and the power amplifier used in the state of art is not necessary. The power consumption of the overall circuit can significantly be reduced.

In a preferred embodiment of the method of the invention a tank circuit of the voltage controlled oscillator is capacitively loaded for direct modulation of the frequency of the voltage controlled oscillator. Thereby, the modulation of the frequency of the voltage controlled oscillator is carried out in a most effective way.

In a further preferred embodiment of the method of the invention an output of the digital/analog converter is directly fed to the voltage controlled oscillator for capacitively loading the tank circuit of the voltage controlled oscillator. As the digital analog converter translates the digital base band signal into a capacitive load, the modulation can be realized by adding or removing this load to or from the tank in order to effect the required frequency changes of the modulation.

In a further preferred embodiment of the method of the invention a crystal oscillator circuit of the voltage controlled oscillator is capacitively loaded for direct modulation of the frequency of the voltage controlled oscillator. An alternative way to introduce the desired modulation in the voltage controlled oscillator is to capacitively loaded a crystal oscillator circuit usually provided as a reference source for the center frequency of the voltage controlled oscillator.

In a further preferred embodiment of the method of the invention an output of the digital/analog converter is directly fed to the crystal oscillator circuit of the voltage controlled oscillator for capacitively loading the crystal oscillator circuit of the voltage controlled oscillator. In a most advantages way, the voltage controlled oscillator can be modulated by tuning of the frequency of the crystal oscillator circuit via the capacitive loading of the digital/analog converter. The voltage controlled oscillator follows the crystal oscillator via the closed PLL loop.

In a further preferred embodiment of the method of the invention a constant amplitude modulation, in particular GFSK (Gaussean frequency shift keying) or GMSK (Gaussean medium shift keying), is used. These specific modulation methods a particularly suitable for the required modulation in Bluetooth and Hiperlan applications.

To achieve the above object, a RF transmitter circuit, in particular for Bluetooth and Hiperlan applications, comprises a voltage controlled oscillator, a digital/analog converter and an antenna circuit, wherein the voltage controlled oscillator is adapted to send an output signal directly to the antenna circuit and wherein the digital/analog converter is arranged to modulate an output frequency of the voltage controlled oscillator. In such a transmitter circuit the voltage controlled oscillator provides sufficient power to send its output signal to the antenna circuit directly whereby the necessity of an upmixer which is power consuming like the power amplifier, is avoided and the power consumption also to the lack of an additional power amplifier is reduced.

In a preferred embodiment of the transmitter circuit of the invention a capacitive load circuit is connected to the tank circuit of the voltage controlled oscillator for modulating the frequency of the voltage controlled oscillator. This is one of the two advantages ways to effect modulation of the voltage controlled oscillator.

In a further preferred embodiment of the transmitter circuit of the invention the digital/analog converter is connected to the voltage controlled oscillator for capacitively loading of the tank circuit of the voltage controlled oscillator. This circuit arrangement is advantages in that no addition circuit stages are provided in between the digital/analog converter and the tank circuit of the voltage controlled oscillator. Rather, the tank circuit is directly influenced by the digital analog converter.

In a further preferred embodiment of the transmitter circuit of the invention a capacitive load circuit is connected a crystal oscillator circuit of the voltage controlled oscillator for modulating the frequency of the voltage controlled oscillator. This is the second one of the two advantages ways of modulating the frequency of the voltage controlled oscillator.

In a further preferred embodiment of the transmitter circuit of the invention the digital/analog converter is connected to the crystal oscillator circuit of the voltage controlled oscillator for capacitively loading the crystal oscillator circuit of the voltage controlled oscillator. Here again, no additional circuitry is needed for modulating the output frequency of the voltage controlled oscillator.

In a further preferred embodiment of the transmitter circuit of the invention the crystal oscillator circuit of the voltage controlled oscillator is coupled to the voltage controlled oscillator via a PLL loop. The PLL loop assures that the voltage controlled oscillator follows the modulation of the crystal oscillator circuit.

In a further preferred embodiment of the transmitter circuit of the invention the PLL loop comprises a divider circuit, a phase detector circuit, and a loop filter circuit. This is an advantages circuit for the PLL loop to achieve the desired function of the PLL loop to assure that the output frequency of the voltage controlled oscillator follows the output of the crystal oscillator circuit.

In a further preferred embodiment of the transmitter circuit of the invention the voltage controlled oscillator comprises a center frequency setting circuit for tuning a center frequency of the voltage controlled oscillator. The center frequency setting circuit enables to tune the center frequency of the voltage controlled oscillator to different values within a certain range of frequency in a simple and advantages way.

In a further preferred embodiment of the transmitter circuit of the invention the center frequency setting circuit for tuning the voltage controlled oscillator comprises a tuning voltage source and a voltage controlled capacitor circuit connected to the tank circuit. This circuit arrangement enables in an advantages way to set the center frequency of the voltage controlled oscillator and also to couple any modulation which might be carried out at the side of the crystal oscillator of the voltage controlled oscillator to the tank circuit of the voltage controlled oscillator.

In a further preferred embodiment of the transmitter circuit of the invention the voltage controllable capacitor circuit connected to the tank circuit comprises two varactors connected as capacitors, a node between the capacitors being connected to the tuning voltage source. The use of varactors enables to embody the voltage controlled capacitor circuit in MOS technology in one piece with the rest of the transmitter circuit In a further preferred embodiment of the transmitter circuit of the invention the tank circuit is connected via a first resistance circuit to ground and via a second resistance circuit to a supply voltage source. This circuit arrangement enable to built the voltage controlled oscillator in an advantages way to have sufficient power to output the output signal directly to the antenna and to drive the antenna circuit accordingly.

In a further preferred embodiment of the transmitter circuit of the invention the first resistance circuit comprises N-type MOSFET devices, and the second resistance circuit comprises P-type MOSFET devices. By the use of such type of active devices, the negative resistance stages between the tank and ground and the tank and supply voltage are embodied in a most efficient way.

In a further preferred embodiment of the transmitter circuit of the invention the digital/analog converter comprises a bit voltage source and a capacitve modulator circuit. Preferably, the capacitive modulator circuit comprises $2^n$ pairs of MOSFET devices, realizing variable voltage controlled capacitance devices, the nodes between the MOSFET devices of a pair forming output nodes of the digital/analog converter. The circuit arrangement of the digital/analog converter is a most efficient way to translate the bit input into an analog output while the output signals of the digital analog converter can be used either to modulate the output of the tank circuit of the voltage controlled oscillator or the crystal oscillator used in the voltage controlled oscillator.

In a further preferred embodiment of the transmitter circuit of the invention the antenna circuit comprises a series of capacitors connected between the outputs of the tank circuit, the capacitors connected between inputs of the antenna circuit being controllable with respect to the capacitance thereof. This circuit arrangement enables to match the antenna circuit or to compensate variations in the antenna aloud by adapting the impedance of the circuit.

Preferred embodiments of the invention are now described with reference to the drawings, in which.

Figure 4:
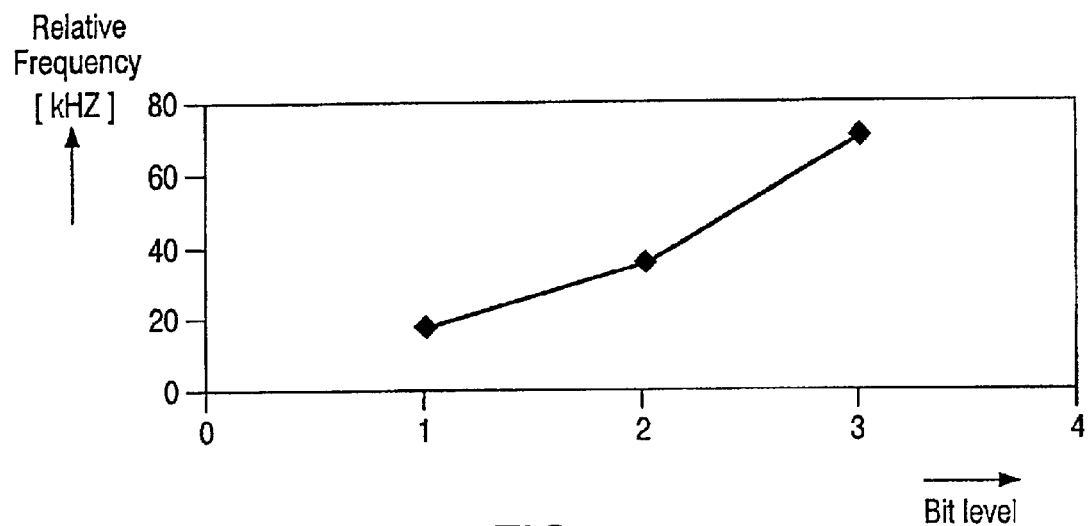
Figure 5:
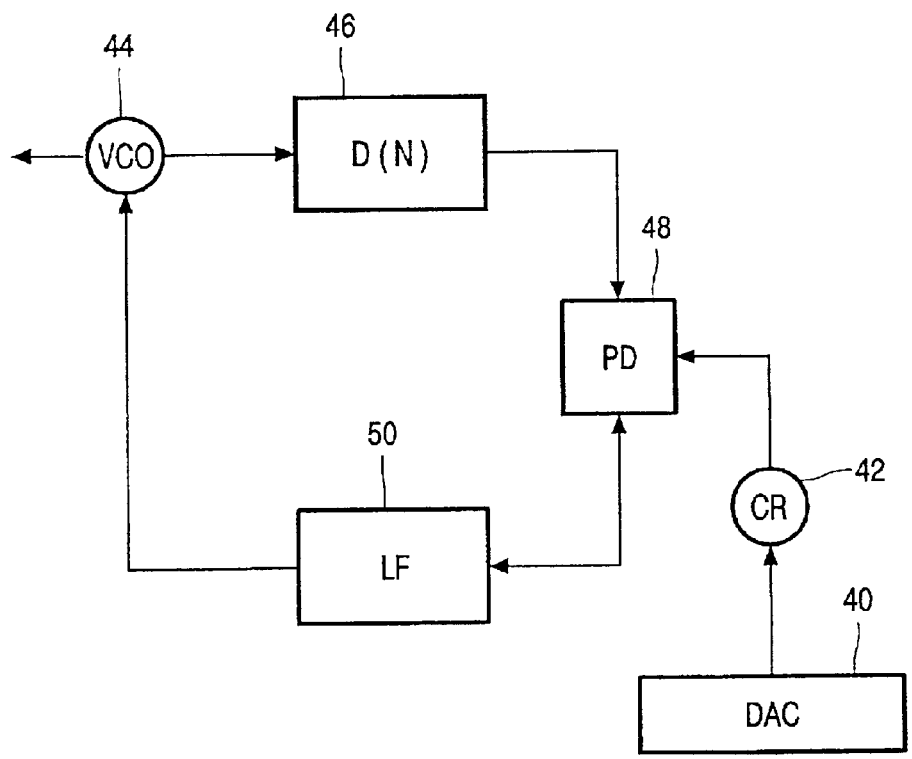

FIG. 4 is a graphical representation of the relative frequency steps for setting bit 0, bit 1 and bit 2, respectively; and FIG. 5 is a schematic block representation of an embodiment where the digital analog converter modulates the crystal oscillator of the voltage controlled oscillator.

Figure 1:
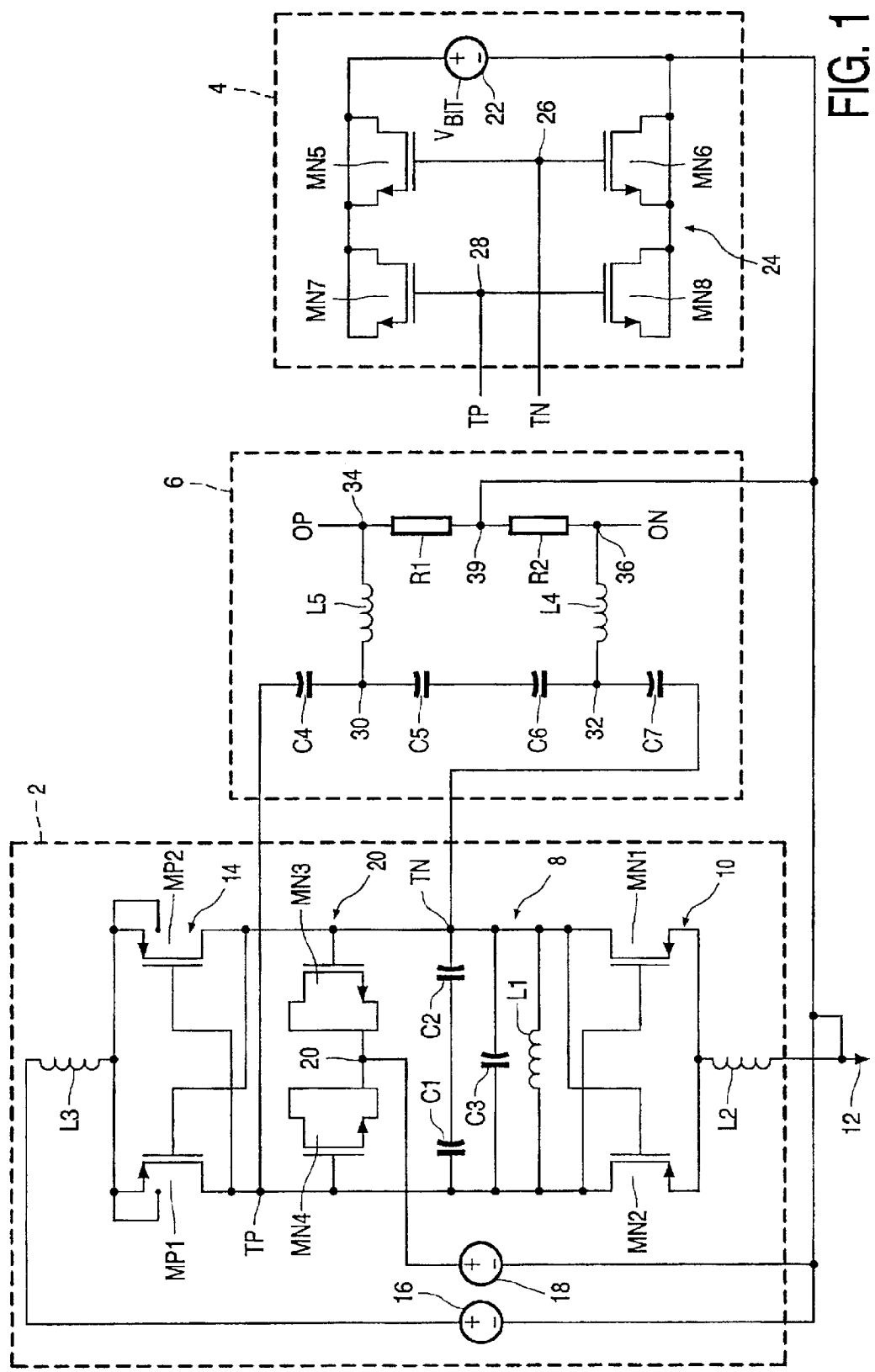
FIG. 1 is a second diagram of a transmitter circuit of the invention.

According to FIG. 1, the transmitter circuit comprises a power voltage controlled oscillator 2, a digital/analog converter 4 and an antenna circuit 6. The voltage controlled oscillator 2 comprises a tank circuit 8 which is connected via a first resistance circuit 10 to ground 12 and via second resistance circuit 14 to a supply voltage source 16 having a supply voltage $V_S$ of 1.8 V in this embodiment.

The tank circuit 8 of the voltage controlled oscillator 2 comprises to capacitors C1 and C2 which are connected between node TP and node TN of the tank circuit 8, a further capacitor C3 connected between the node TP and the node TN of the tank circuit 8 as well as an inductor L1 also connected between the node TP and TN of the tank circuit 8. The first resistance circuit 10 comprises two MOSFET devices MN1 and MN2 which form, in the circuit arrangement shown in FIG. 1, a negative resistance stage between the tank circuit 8 and ground 12. The two MOSFET devices MN1 and MN2 are N-type MOSFET. They may be also bipolar, NPN, PNP, MESFET or similar devices if the circuits are adapted accordingly. Between the first resistance circuit 10 and ground 12 there is an inductor L2.

The second resistor circuit 14 comprises two MOSFET devices MP1 and MP2 which form, in the second arrangement shown in FIG. 1, a negative resistance stage between the tank 8 and the supply voltage Vs. The two MOSFET devices MP1 and MP2 are P-type MOSFET devices. They may be also bipolar, NPN, PNP, MESFET or similar devices if the circuits are adapted accordingly. Between the second resistor circuit 14 and the supply voltage source 16 is a further inductor L3.

According to FIG. 1, the voltage controlled oscillator 2 comprises a center frequency setting circuit comprising a tuning voltage source 18 and a voltage controlled capacitor circuit 20 connected to the tank circuit 8 for tuning the center frequency of the voltage controlled oscillator 2. The voltage controlled capacitor circuit 20 comprises two varactors (voltage controlled capacitance devices) MN3, MN4, a node 22 between the two varactors MN3, MN4 being connected to the tuning voltage source 18. The other terminal of the tuning voltage source 18B connecting to ground 12. The base terminals of varactors MN3 and MN4 are connected to node TN and node TP respectively.

The digital analog converter 4 comprises a bit voltage source 22 and a capacitive modulator circuit 24. The capacitive modulator circuit 24 comprises two pairs of varactors MN5, MN6 and MN7, MN8 respectively which realize, in the circuit arrangement shown, variable voltage controlled capacitances. The nodes 26, 28 between the varactor pair MN5, MN6 and the varactor pair MN7, MN8 respectively are connected to the nodes TN and TP of the voltage controlled oscillator 2 respectively. The nodes 26, 28 are connected to the base terminals of the varactors MN5 to MN8, the other terminals of the varactors MN5 and MN7 and the varactors MN6, MN8 respectively are connected to the bit voltage source 22 and to ground 12 respectively.

It is to be noted that the digital analog converter 4 of FIG. 1 shows only a bit 1 embodiment. To extend the digital analog converter 4 to more bits, there are the following possibilities:

(a) Bit 1 is represented by two pairs of MOSFET devices as shown in FIG. 1, bit 2 is represented by four pairs of MOSFET devices having the same dimensions as the devices shown in FIG. 1, and bit n is represented by $2^n$ pairs of MOSFET devices having the same dimensions as the devices shown in FIG. 1 for bit 1.

(b) Bit n is also a two-pair configuration. Then, the dimension of the devices is $2^n$ times lager then the dimension of the devices shown in FIG. 1.

(c) A combination of (a) and (b).

The antenna circuit 6 comprises a series of capacitors C4, C5, C6 and C7 between nodes TP and TN of the tank circuit 8. At least, the capacitors C5 and C6 connected between power nodes 30, 32 of the antenna circuit 6 are controllable with respect to the capacitances thereof. The capacitors C4 to C7 load the tank and hence the center frequency. In order to be tunable, at least the capacitors C5 and C6 are embodied as MOS capacitors. In this manner, the amplitude of the signal can be changed, and a variation of the antenna load can be compensated in an adaptation of the impedance.

The antenna circuit 6 of FIG. 1 furthermore comprises two resisters R1 and R2 which represent the antenna in the antenna circuit. The resister R1 is connected through an inductor L5 to the power node 30 of the antenna circuit 6, and the resistor R3 is connected to the power node 32 of the antenna circuit through an inductor 14. The inductors 14 and L5 represent the inductances of bond wire used to make the connections to the antenna. A node 34 between the resister R1 and the inductor L5 forms the output OP of the antenna circuit, whereas a node 36 between the resister R2 and the inductor 14 forms the output ON of the antenna circuit 6. A node 39 between the two resistors R1, R2 is connected to ground 12.

Figure 2:
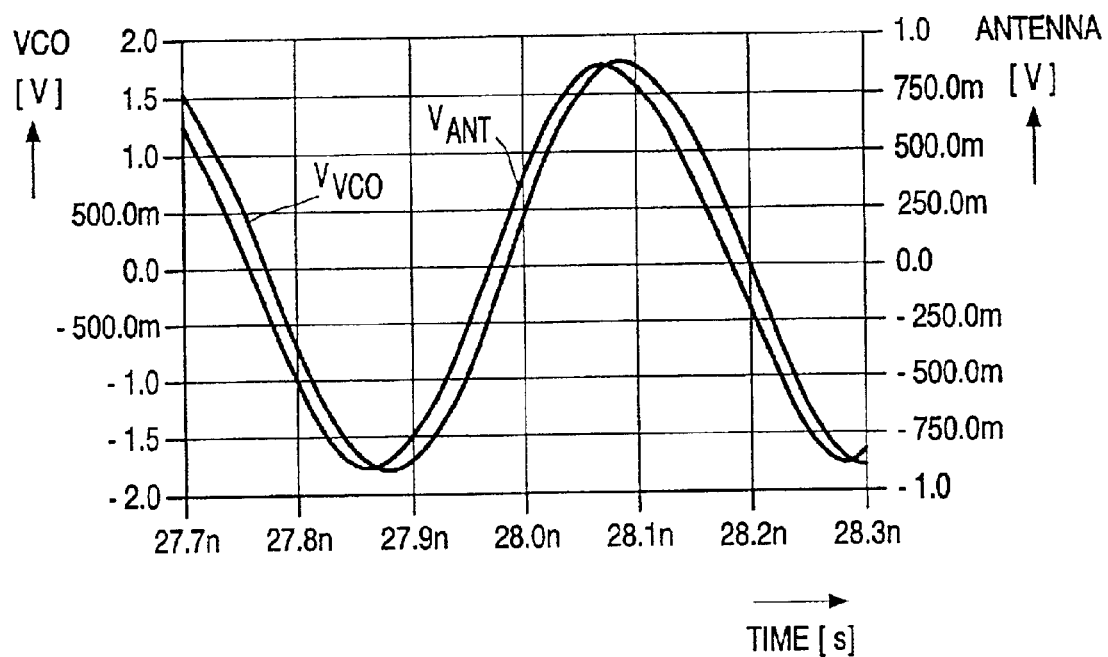
FIG. 2 is graphical representation of the power of the output signal of the voltage controlled oscillator and the power of the output signal of the antenna circuit versus time.

FIG. 2 shows a graphical representation of the voltage output signal of the voltage controlled oscillator 2 and the voltage output of the antenna circuit 4 versus this time. The voltage output of the voltage controlled oscillator is marked $V_{VCO}$, and the voltage output of the antenna circuit is marked $V_{ANT}$. It is apparent from FIG. 2 that, taking the resister differential value at resistors R1, R2 (antenna) of the antenna circuit 6 to be 150 Ω and the output peak voltage of the voltage controlled oscillator to be 1.8 V, the output peak voltage of the antenna circuit is 0.8 V. This is a quite satisfactory result having regard to the applications considered.

Figure 3:
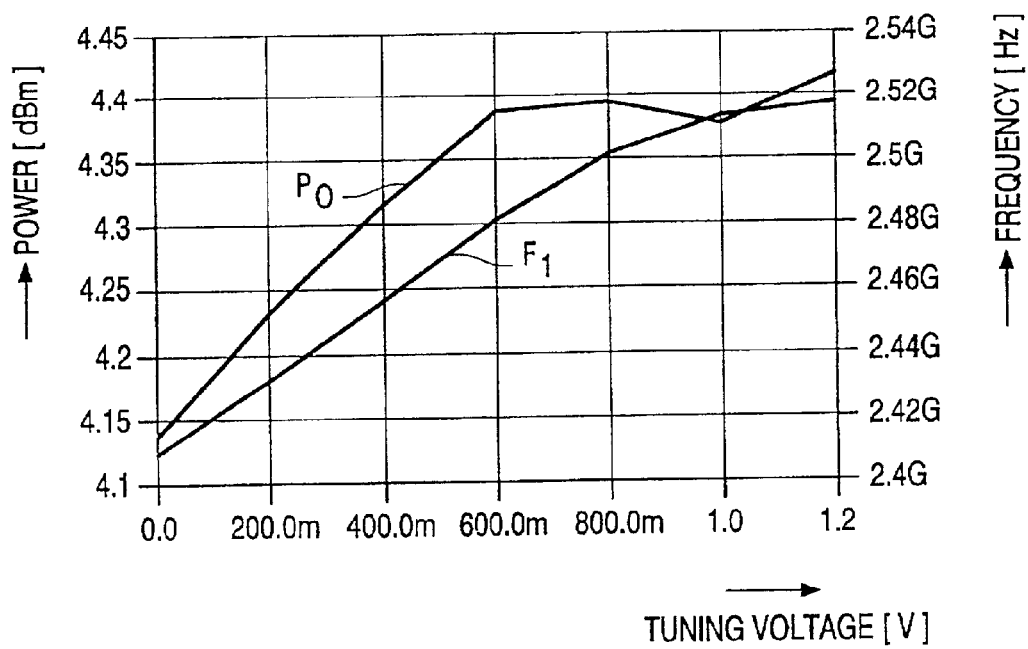
FIG. 3 shows the power characteristic of the power sent by the voltage controlled oscillator to the antenna circuit as well as the variation of the frequency as a function of the voltage at the voltage controlled capacitor circuit in the voltage controlled oscillator.

FIG. 3 shows the result of the power sent by the power voltage controlled oscillator to the antenna circuit as well as the variation of the frequency as a function of the voltage on the varactors MN3, MN4 in the voltage controlled oscillator 2. The power curve is marked as $P_O$, and the frequency curve is marked as $F_f$. FIG. 3 shows that the power output $P_O$ only changes between 4.15 dBm and 4.4 dBm for a voltage differential of 1.2 V of the voltage controlled oscillator corresponding to a tuning of about 120 MHz or for a frequency difference between 2.4 GHz and 2.52 GHz. This shows that the power sent by the antenna circuit hardly changes under the influence of tuning in the inventive transmitter circuit.

FIG. 4 shows a graphical representation of the relative frequency steps given for setting bit 0, bit 1 and bit 2 respectively. The x-axis shows the bit level, the y-axis shows the relative frequency in kHz, the absolute frequency being 2.45 GHz. In the shown embodiment, the steps for setting the bits are related to an accuracy of 18 kHz, namely the center frequency increases by 18 kHz for bit 1, the center frequency increases by 36 kHz for bit 2 which is twice 18 kHz, and the center frequency increases by 72 kHz for bit 3 which is four times 18 kHz. According to the Bluetooth standard, a modulation of 60 kHz per bit at a 6-bit digital/analog converter is required. FIG. 4 shows that such a modulation is enabled by using a digital/analog converter using the one-bit embodiment of the digital/analog converter which is shown in FIG. 1. Such a digital/analog converter is adapted for direct modulation of the voltage controlled oscillator in Bluetooth applications, and it is sufficient that the PLL loop associated with the crystal oscillator brings the voltage controlled oscillator near to the center frequency thereof. Therefore, the frequency is quite free within the modulation width.

FIG. 5 shows another embodiment of the RE transmitter circuit of the invention where a digital/analog converter (DAC) 40 is connected to the crystal oscillator circuit 42 associated with the voltage controlled oscillator 44 for capacitively loading the crystal oscillator circuit of the voltage controlled oscillator. The crystal oscillator circuit (CR) 42 is connected to the voltage controlled oscillator (VCO) 42 via a PLL loop comprising a divide circuit 46 (D(N)), a phase detector circuit (PD) 48 and a loop filter circuit (LF) 50. The digital analog converter 40 and the voltage controlled oscillator 44 of FIG. 5 may be embodied as shown in FIG. 1.

In the embodiment of FIG. 5, the digital analog converter 40 modulates the reference frequency of the crystal oscillator circuit 42 which in itself provides the reference frequency for the PLL loop. The PLL loop is built that such the output voltage of the loop filter circuit 50 sets the center frequency of the voltage controlled oscillator 44. This frequency is found to be N times the reference frequency as the divider circuit 46 divides by N. When the reference frequency is varied, the output of the loop filter circuit 50 follows these variations and, thereby, modulates the frequency of the voltage controlled oscillator 44.

An embodiment of the above described transmitter circuit designed for a power of 4 dBm and a tuning of 120 MHz, which is sufficient for the Bluetooth standard, shows a dissipation of only 4 mA 1.8 V supply voltage. This is a major improvement with respect to the characteristics of transmitter circuits of the state of the art.

The necessary modification of the data is at least a constant amplitude modulation. In the case of Bluetooth, the modulation can be GFSK (Gaussean frequency shift keying) or GMSK (Gaussean medium shift keying). This modulation can be realized in the following ways:

(a) to load the tank circuit by means of capacitive modulation through the digital analog converter which translates the digital baseband signal into a capacitive load. By adding or removing this load to or from the tank circuit 8, the frequency changes which means that frequency modulation is obtained.

(b) As the voltage controlled oscillator is normally connected to a crystal oscillator by a PILL loop, the voltage controlled oscillator can also be modulated by tuning the frequency of the crystal oscillator via the capacitive loading by means of the digital analog converter. The voltage controlled oscillator follows the crystal oscillator via the closed PLL loop.

What is claimed is:

1. A method for modulating an output voltage of a transmitter circuit, comprising a voltage controlled oscillator with a modulation input, a digital/analog converter and an antenna circuit, the method comprising sending an output signal from the voltage controlled oscillator directly to the antenna circuit and directly modulating a frequency of the output signal of the voltage controlled oscillator, by applying an output signal of the D/A converter to the modulation input of the voltage-controllers oscillator, wherein a crystal oscillator circuit associated with the voltage controlled oscillator is capacitively loaded for direct modulation of the frequency of the voltage controlled oscillator.

2. The method of claim 1, wherein a tank circuit of the voltage controlled oscillator is capacitively loaded for direct modulation of the frequency of the voltage controlled oscillator.

3. A transmitter circuit, in particular for Bluetooth and Hiperlan applications, comprising a voltage controlled oscillator having a tank circuit, a digital/analog converter and an antenna circuit, wherein the voltage controlled oscillator is adapted to send an output signal of sufficient power directly to the antenna circuit and wherein the digital/analog converter is arranged to modulate an output frequency of the voltage controlled oscillator, and wherein the tank circuit is connected via a first resistance circuit to ground and via a second resistance circuit to a supply voltage source.

4. The transmitter circuit of claim 3, wherein a capacitive load circuit is connected to the tank circuit of the voltage controlled oscillator for modulating the frequency of the voltage controlled oscillator.

5. The transmitter circuit of claim 3, wherein a capacitive load circuit is connected a crystal oscillator circuit associated with the voltage controlled oscillator for modulating the frequency of the voltage controlled oscillator.

6. The transmitter circuit of claim 3, wherein the voltage controlled oscillator comprises a center frequency setting circuit far tuning a center frequency of the voltage controlled oscillator.

7. The transmitter circuit of claim 6, wherein the center frequency setting circuit for tuning the voltage controlled oscillator comprises a tuning voltage source and a voltage controlled capacitor circuit connected to the tank circuit.

8. The transmitter circuit of claim 3, wherein the antenna circuit comprises a series of capacitors connected between the outputs of the tank circuit, the capacitors connected between power nodes of the antenna circuit being controllable with respect to the capacitance thereof.

9. A transmitter circuit, comprising a voltage controlled oscillator having a tank circuit, a digital/analog converter and an antenna circuit, wherein the voltage controlled oscillator is adapted to send an output signal of sufficient power directly to the antenna circuit and wherein the digital/analog converter is arranged to modulate an output frequency of the voltage controlled oscillator, wherein the antenna circuit comprises a series of capacitors connected between the outputs of the tank circuit, the capacitors connected between power nodes of the antenna circuit being controllable with respect to the capacitance thereof.

* * * * *